United States Patent [19]
Stockstad et al.

[11] Patent Number: 6,087,969
[45] Date of Patent: Jul. 11, 2000

[54] SIGMA-DELTA MODULATOR AND METHOD FOR DIGITIZING A SIGNAL

[75] Inventors: Troy Lynn Stockstad, Chandler; Douglas A. Garrity, Gilbert, both of Ariz.

[73] Assignee: Motorola, Inc., Schaumburg, Ill.

[21] Appl. No.: 09/067,147

[22] Filed: Apr. 27, 1998

[51] Int. Cl.[7] .................................................. H03M 3/00
[52] U.S. Cl. .......................................... 341/143; 341/155
[58] Field of Search .................................... 341/143, 155, 341/144, 141

[56] References Cited

U.S. PATENT DOCUMENTS

| | | | |
|---|---|---|---|
| 4,439,756 | 3/1984 | Shenoi et al. | 341/143 |
| 5,150,120 | 9/1992 | Yunus | 341/143 |
| 5,329,282 | 7/1994 | Jackson | 341/143 |
| 5,341,135 | 8/1994 | Pearce | 341/120 |
| 5,442,353 | 8/1995 | Jackson | 341/143 |
| 5,689,449 | 11/1997 | Saramaki et al. | 364/724.1 |
| 5,736,950 | 4/1998 | Harris et al. | 341/143 |

FOREIGN PATENT DOCUMENTS 757446  5/1997  European Pat. Off. .........  H03M 1/12

OTHER PUBLICATIONS

"Quadrature Bandpass ΔΣ Modulation for Digital Radio" by Stephen A. Jantzi, Member, IEEE, Kenneth W. Martin, Fellow, IEEE, and Adel S. Sedra, Fellow, IEEE, IEEE Journal of Solid–State Circuits, vol. 32, No. 12, Dec. 1997.

*Primary Examiner*—Peguy JeanPierre
*Attorney, Agent, or Firm*—Anthony M. Martinez

[57] ABSTRACT

A sigma-delta modulator (10) and a method for digitizing an analog signal. The sigma-delta modulator includes at least one switch (16) for altering the order of the sigma-delta modulator (10). The order of the sigma-delta modulator (10) is changed based on the communication protocol of the received analog signal. More particularly, the order of the sigma-delta modulator (10) is increased for communication protocols having wide information-bandwidths. Alternatively, the order of the sigma-delta modulator (10) is decreased for communication protocols having narrow information-bandwidths.

18 Claims, 2 Drawing Sheets

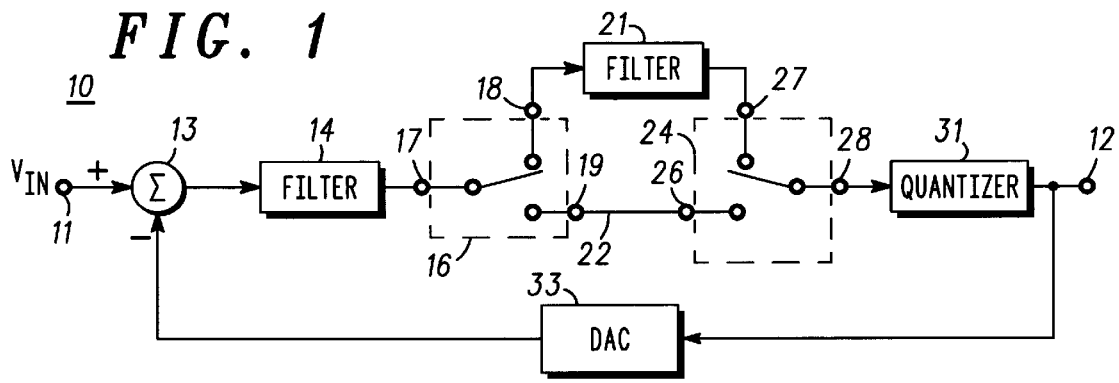
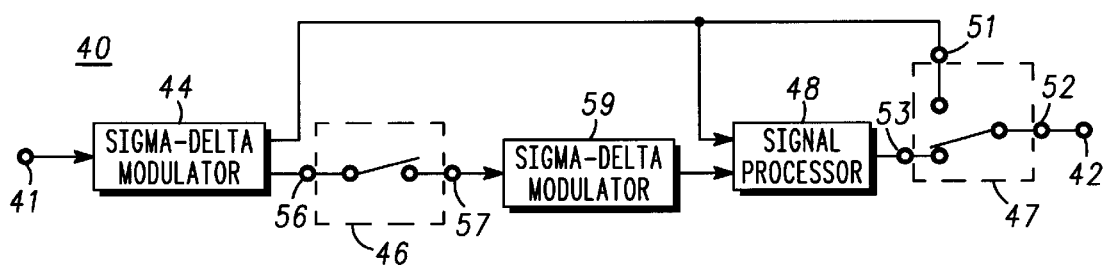
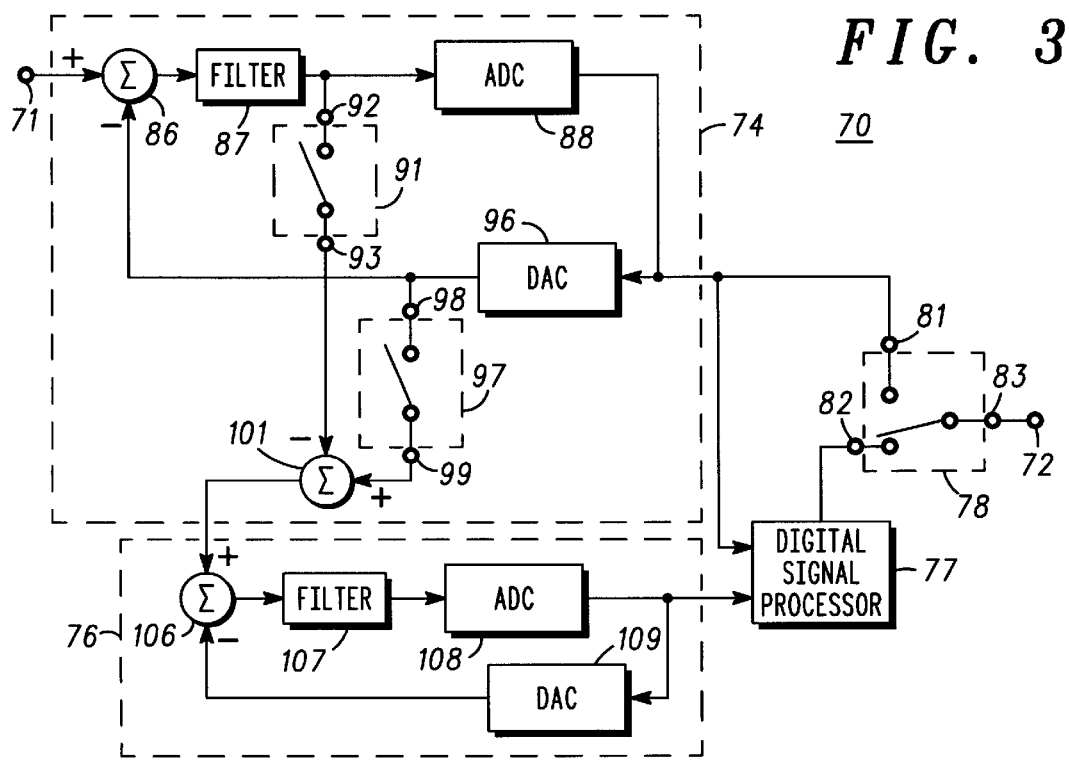

6,087,969

SIGMA-DELTA MODULATOR AND METHOD FOR DIGITIZING A SIGNAL

FIELD OF THE INVENTION

The present invention relates, in general, to Analog-to-Digital Converters (ADCs) and, more particularly, to sigma-delta analog-to-digital converters.

BACKGROUND OF THE INVENTION

There are two basic techniques for implementing Analog-to-Digital Converters (ADCs), the open-loop technique and the feedback technique. An open-loop converter generates a digital code directly upon application of an input voltage, and is generally asynchronous in operation. A feedback converter generates a sequence of digital codes from an input signal and reconverts these digital codes to an analog signal.

Sigma-delta ADCs use the feedback technique. The sigma-delta technique is attractive because it achieves high resolution by precise timing instead of precisely matched on-chip components, such as resistors and capacitors used in open-loop converters. Thus, the sigma-delta technique is the technique of choice for many integrated circuit applications.

A basic sigma-delta ADC receives an analog input signal and subtracts a feedback signal from the analog input signal to provide an error signal. The error signal is processed through a lowpass filter and then quantized to form a digital output signal. A feedback Digital-to-Analog Converter (DAC) provides the feedback signal after converting the digital output signal to analog form. Aside from the feedback DAC, the basic sigma-delta ADC may be implemented with conventional analog components such as operational amplifiers, comparators, and switched-capacitor filters. The basic sigma-delta ADC usually provides high resolution because integrated circuit clocking speeds allow the analog input signal to be highly oversampled. The basic sigma-delta ADC also has a high Signal-to-Noise Ratio (SNR) because the lowpass filter shapes quantization noise out-of-band, which can then be sufficiently attenuated by conventional filtering techniques.

While the basic sigma-delta ADC is easy to implement in conventional integrated circuit processes and generally has high performance, it is not ideal for some applications. For example, a receiver having a basic sigma-delta ADC is not ideal for receiving multiple communication protocols such as Code Division Multiple Access (CDMA), Time Division Multiple Access (TDMA), Global System for Mobile communication (GSM), and Advanced Mobile Phone Service (AMPS). These protocols each have different information-bandwidths, e.g., the information-bandwidth of a CDMA signal is approximately 1 megahertz (MHz), whereas the information-bandwidth of a GSM signal is approximately 200 kilohertz (kHz). A problem with a receiver having a basic sigma-delta ADC for receiving multiple communication protocols is that the dynamic range of the sigma-delta ADC varies with the information-bandwidth of the received signal. The dynamic range of the sigma-delta ADC decreases as the information-bandwidth of the received signal increases.

Accordingly, it would be advantageous to have a sigma-delta ADC and method for receiving multiple protocols. It would be of further advantage for the sigma-delta ADC to have an adjustable information-bandwidth while maintaining the dynamic range of the sigma-delta ADC.

BRIEF DESCRIPTION OF THE DRAWINGS

FIG. 1 is a block diagram of a sigma-delta modulator in accordance with a first embodiment of the present invention;

FIG. 2 is a block diagram of a sigma-delta modulator in accordance with a second embodiment of the present invention;

FIG. 3 is a block diagram of a cascaded sigma-delta modulator in accordance with a third embodiment of the present invention;

DETAILED DESCRIPTION OF THE DRAWINGS

Figure 4:
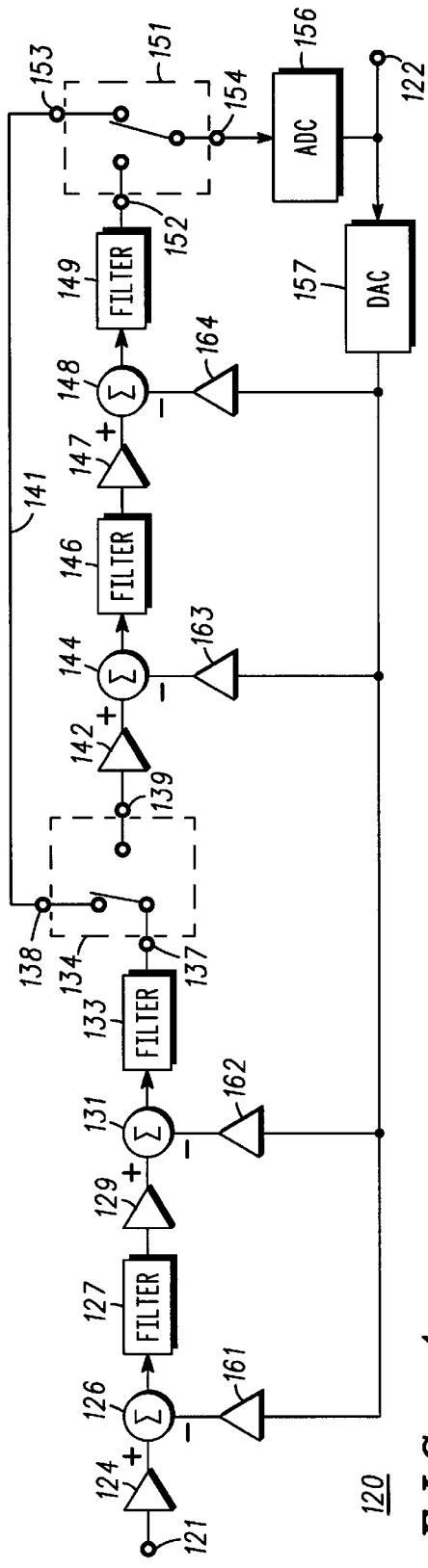
FIG. 4 is a block diagram of a single-loop sigma-delta modulator in accordance with a fourth embodiment of the present invention.

Generally, the present invention provides a sigma-delta modulator and a method for digitizing an analog signal having a protocol. In accordance with the present invention, the sigma-delta modulator includes at least one switch for selecting a signal path in accordance with the protocol of the signal. The order of the sigma-delta modulator is altered in accordance with the protocol of the signal. More particularly, the order of the sigma-delta modulator is increased for protocols having wide information-bandwidths. Alternatively, the order of the sigma-delta modulator is decreased for protocols having narrow information-bandwidths. Altering the order of the sigma-delta modulator in this fashion results in a sigma-delta modulator that maintains its dynamic range while receiving signals having varying information-bandwidths. In other words, the dynamic range of the sigma-delta modulator remains substantially constant for receiving signals having either narrow or wide information-bandwidths.

FIG. 1 is a block diagram of a sigma-delta modulator 10 in accordance with a first embodiment of the present invention. Sigma-delta modulator 10 has an input terminal 11 for receiving an analog input signal $V_{IN}$ and an output terminal 12. In addition, sigma-delta modulator 10 includes a summing device 13 having a positive input connected to input terminal 11, a negative input, and an output. As those skilled in the art are aware, the function of summing device 13 can also be achieved by using a summing device having two positive inputs preceded by an inverting gain stage. The output of summing device 13 is connected to the input of a filter 14 and the output of filter 14 is connected to a switch 16. By way of example, filter 14 is a fourth-order bandpass filter and switch 16 is a single-throw double-pole switch having a plurality of terminals 17, 18, and 19. Terminal 17 is connected to the output of filter 14, terminal 18 is connected to the input of a fourth-order bandpass filter 21, and terminal 19 is connected to the first terminal of a transmission path 22. The second terminal of transmission path 22 is connected to a single-throw double-pole switch 24 having a plurality of terminals 26, 27, and 28. Terminal 26 is connected to the second terminal of transmission path 22, terminal 27 is connected to the output of filter 21, and terminal 28 is connected to the input of a quantizer 31. The output of quantizer 31 is commonly connected to output terminal 12 and the input of a Digital-to-Analog Converter (DAC) 33. The output of DAC 33 is connected to the negative input of summing device 13. In this example, quantizer 31 is a single-bit quantizer and DAC 33 is a single-bit DAC. It should be noted that quantizer 31 can also be a multi-bit quantizer and DAC 33 can be a multi-bit DAC.

Although switches 16 and 24 are illustrated as single-throw double-pole switches, this is not a limitation of the present invention. For example, switches 16 and 24 can be transmission gates. Depending on the position of switches 16 and 24, the output of filter 14 is coupled to the input of quantizer 31 via transmission path 22 or the output of filter 14 is coupled to the input of quantizer 31 via filter 21. In other words, the signal path from the output of filter 14 to the input of quantizer 31 is selected by toggling the position of switches 16 and 24.

The positions of switches 16 and 24 are controlled by a control device (not shown) to be in one of two positions. Examples of suitable control devices include a Central Processing Unit (CPU), an Application Specific Integrated Circuit (ASIC), a Digital Signal Processor (DSP), etc. When switch 16 is in a first position, the output of filter 14 is electrically connected to the input of filter 21. On the other hand, when switch 16 is in a second position, the output of filter 14 is electrically connected to the first terminal of transmission path 22. Similarly, when switch 24 is in a first position, the output of filter 21 is electrically connected to the input of quantizer 31. When switch 24 is in a second position, the input of quantizer 31 is electrically connected to the second terminal of transmission path 22.

The configuration of sigma-delta modulator 10 is altered by changing the positions of switches 16 and 24. More particularly, the order of sigma-delta modulator 10 is altered by changing the positions of switches 16 and 24. For example, when switches 16 and 24 are in their first positions, sigma-delta modulator 10 is an eighth-order sigma-delta modulator. When switches 16 and 24 are in their second positions, sigma-delta modulator 10 is a fourth-order sigma-delta modulator. Although filters 14 and 21 are described as fourth-order bandpass filters, this is not a limitation of the present invention. Filters 14 and 21 can be single-order lowpass filters, second-order lowpass filters, etc. In addition, filters 14 and 21 can have different order values, e.g., filter 14 can be a second-order bandpass filter and filter 21 can be a fourth-order bandpass filter.

The positions of switches 16 and 24 are set in accordance with the communication protocol of analog input signal $V_{IN}$. In one example, the control device (not shown) determines the communication protocol of analog input signal $V_{IN}$. The control device sets switches 16 and 24 in their first positions to provide a higher-order sigma-delta modulator for communication protocols having a wide information-bandwidth of 200 kHz. Switches 16 and 24 are set in their second positions by the control device to provide a lower-order sigma-delta modulator for communication protocols having a narrow information-bandwidth of 10 kHz. Increasing the order of sigma-delta modulator 10 allows the dynamic rage of modulator 10 to remain substantially constant when receiving analog signals having either narrow or wide information-bandwidths. In addition, while toggling switches 16 and 24 between their first and second positions, the inactive portion of sigma-delta modulator 10 can be powered down or turned off for conserving power. In the present example, when switches 16 and 24 are in their second positions, filter 21 is the inactive portion of modulator 10. Therefore, the active elements of filter 21 can be turned off.

Still referring to FIG. 1, sigma-delta modulator 10 generates a digital signal at output terminal 12 by digitizing analog signal $V_{IN}$. More particularly, summing device 13 generates an error signal by subtracting a feedback signal from analog input signal $V_{IN}$. The feedback signal is generated by DAC 33 and is transmitted from the output of DAC 33 to the negative input of summing device 13. The error signal is transmitted from the output of summing device 13 to the input of filter 14. Filter 14 processes the error signal and generates a first filtered signal. If switch 16 is in the first position and switch 24 is in the first position, then the first filtered signal is transmitted from the output of filter 14 to the input of filter 21. Filter 21 processes the first filtered signal and generates a second filtered signal that is transmitted to the input of quantizer 31. If switch 16 is in the second position and switch 24 is in the second position, then the first filtered signal is transmitted from the output of filter 14 to the input of quantizer 31. Depending on the positions of switches 16 and 24, quantizer 31 digitizes either the first filtered signal or the second filtered signal and generates a digital signal. The digital signal is transmitted to output terminal 12 and to the input of DAC 33. DAC 33 generates the feedback signal from the digital signal.

Although sigma-delta modulator 10 is shown as having two switches, i.e., switches 16 and 24, for altering its order, this is not a limitation of the present invention. Sigma-delta modulator 10 can have only one switch, i.e., switch 24, for altering its configuration. In the example of sigma-delta modulator 10 having one switch, the output of filter 14 is commonly connected to the input of filter 21 and terminal 26 of switch 24. In addition, sigma-delta modulator 10 may have three, four, five, or more switches.

FIG. 2 is a block diagram of a sigma-delta modulator 40 having an input terminal 41 and an output terminal 42 in accordance with a second embodiment of the present invention. Modulator 40 includes a sigma-delta modulator 44 having an input connected to input terminal 41, an analog output connected to a switch 46, and a digital output commonly connected to a switch 47, and a signal processor 48. By way of example, sigma-delta modulator 44 is a second-order sigma-delta modulator, signal processor 48 is a digital filter, and switch 47 is a single-throw double-pole switch having a plurality of terminals 51, 52, and 53. The digital output of sigma-delta modulator 44 is commonly connected to terminal 51 and to the first input of signal processor 48. Terminal 52 is connected to output terminal 42. Switch 46 has a terminal 56 connected to the analog output of sigma-delta modulator 44 and a terminal 57 connected to a sigma-delta modulator 59. Sigma-delta modulator 59 is, for example, a second-order sigma-delta modulator having an input connected to terminal 57 and an output connected to the second input of signal processor 48. The output of signal processor 48 is connected to terminal 53 of switch 47.

When switch 46 is in a first position, terminal 56 is electrically connected to terminal 57. On the other hand, when switch 46 is in a second position, terminal 56 is electrically isolated from terminal 57. Terminal 53 is electrically connected to terminal 52 when switch 47 is in a first position and terminal 51 is electrically connected to terminal 52 when switch 47 is in a second position.

In operation, input terminal 41 receives an analog input signal. A control device (not shown) determines the communication protocol of the analog input signal and sets switches 46 and 47 in accordance with the communication protocol of the analog input signal. For example, the control device sets switches 46 and 47 in their first positions for communication protocols having a wide information-bandwidth of 200 kHz. On the other hand, the control device sets switches 46 and 47 in their second positions for communication protocols having a narrow information-bandwidth of 10 kHz.

Sigma-delta modulator 44 receives the analog input signal from input terminal 41. Sigma-delta modulator 44 generates a first digital signal by digitizing the analog input signal.

When switches 46 and 47 are in their second positions, the first digital signal is transmitted from the digital output of sigma-delta modulator 44 to output terminal 42 since switch 47 is in its second position. In addition, when switches 46 and 47 are set in their second positions, the inactive portions of sigma-delta modulator 40 are powered down for conserving power, i.e., signal processor 48 and sigma-delta modulator 59 are powered down.

When switches 46 and 47 are in their first positions, the first digital signal is transmitted from the digital output of sigma-delta modulator 44 to the first input of signal processor 48. In addition, sigma-delta modulator 44 generates an analog output signal and transmits the analog output signal from the analog output of sigma-delta modulator 44 to the input of sigma-delta modulator 59. Sigma-delta modulator 59 generates a second digital signal by digitizing the analog output signal. The second digital signal is transmitted from the output of sigma-delta modulator 59 to the second input of signal processor 48. Signal processor 48 generates a digital output signal by combining the first digital signal and the second digital signal to cancel out the quantization noise from the first digital signal. The digital output signal is transmitted to output terminal 42 from the output of signal processor 48 since switch 47 is in its first position.

Although signal processor 48 is described as a digital filter, this is not a limitation of the present invention. Signal processor 48 can also be implemented using a digital signal processor or a digital circuit comprised of flip-flops and logic gates.

Modulator 40 provides a device for digitizing an analog signal. Switches 46 and 47 provide a means for altering the order of modulator 40 in accordance with the communication protocol of the received analog signal. By altering the order of modulator 40, the dynamic range of modulator 40 is improved for receiving multiple protocols compared to sigma-delta modulators having a fixed order. More particularly, the SNR of modulator 40 remains substantially constant when receiving analog signals having either wide or narrow information-bandwidths. In addition, modulator 40 cascades at least two sigma-delta modulators to produce a higher-order modulator for receiving analog signals having wide information-bandwidths. By cascading at least two sigma-delta modulators, modulator 40 reduces problems with stability that higher-order single-loop modulators exhibit.

It should be noted that the orders of sigma-delta modulators 44 and 59 are not limitations of the present invention. Depending on the application, sigma-delta modulators 44 and 59 can be single-order modulators, fourth-order modulators, etc. In addition, sigma-delta modulators 44 and 59 can have different order values, e.g., sigma-delta modulator 44 can be a single-order modulator and sigma-delta modulator 59 can be a second-order modulator.

Although sigma-delta modulator 40 is shown as having two switches, i.e., switches 46 and 47, for altering its order, this is not a limitation of the present invention. Sigma-delta modulator 40 can have only one switch, i.e., switch 47, for altering its configuration. In the example of sigma-delta modulator 40 having one switch, the analog output of sigma-delta modulator 44 is connected to the input of sigma-delta modulator 59.

FIG. 3 is a block diagram of a cascaded sigma-delta modulator 70 having an input terminal 71 and an output terminal 72 in accordance with a third embodiment of the present invention. Modulator 70 has two cascaded sigma-delta modulators 74 and 76, a Digital Signal Processor (DSP) 77, and a switch 78. By way of example, sigma-delta modulators 74 and 76 are fourth-order bandpass sigma-delta modulators and switch 78 is a single-throw double-pole switch having a plurality of terminals 81, 82, and 83. Sigma-delta modulator 74 has an input connected to input terminal 71, an analog output coupled to the input of sigma-delta modulator 76, and a digital output commonly connected to a first input of DSP 77 and to terminal 81 of switch 78. Terminal 83 of switch 78 is connected to output terminal 72. The output of sigma-delta modulator 76 is connected to a second input of DSP 77 and the output of DSP 77 is connected to terminal 82 of switch 78.

Sigma-delta modulator 74 includes a summing device 86 having a positive input connected to the input of sigma-delta modulator 74, a negative input, and an output connected to a filter 87. Filter 87 is, for example, a fourth-order bandpass filter having an input connected to the output of summing device 86 and an output commonly connected to the input of an Analog-to-Digital Converter (ADC) 88 and to a switch 91. Switch 91 has a terminal 92 connected to the output of filter 87 and a terminal 93. The output of ADC 88 is commonly connected to the digital output of sigma-delta modulator 74 and to the input of a DAC 96. The output of DAC 96 is commonly connected to the negative input of summing device 86 and a switch 97. Switch 97 has a terminal 98 connected to the output of DAC 96 and a terminal 99 connected to a summing device 101. Summing device 101 has a positive input connected to terminal 99 of switch 97, a negative input connected to terminal 93 of switch 91, and an output connected to the analog output of sigma-delta modulator 74.

Sigma-delta modulator 76 includes a summing device 106 having a positive input connected to the input of sigma-delta modulator 76, a negative input, and an output connected to a filter 107. Filter 107 is, for example, a fourth-order bandpass filter having an input connected to the output of summing device 106 and an output connected to the input of an ADC 108. The output of ADC 108 is commonly connected to the output of sigma-delta modulator 76 and to the input of a DAC 109. The output of DAC 109 is connected to the negative input of summing device 106.

It should be noted that the orders of sigma-delta modulators 74 and 76 are not limitations of the present invention. Depending on the application, sigma-delta modulators 74 and 76 can be single-order modulators, second-order modulators, etc. In addition, sigma-delta modulators 74 and 76 can have different order values, e.g., sigma-delta modulator 74 can be a second-order modulator and sigma-delta modulator 76 can be a fourth-order modulator. Further, sigma-delta modulators 74 and 76 can be lowpass sigma-delta modulators instead of bandpass sigma-delta modulators.

When switch 91 is in a first position, terminal 92 is electrically connected to terminal 93. On the other hand, when switch 91 is in a second position, terminal 92 is electrically isolated from terminal 93. Similarly, when switch 97 is in a first position, terminal 98 is electrically connected to terminal 99. Terminal 98 is electrically isolated from terminal 99 when switch 97 is in a second position. Terminal 82 of switch 78 is electrically connected to terminal 83 when switch 78 is in a first position and terminal 81 is electrically connected to terminal 83 when switch 78 is in a second position.

In operation, input terminal 71 receives an analog input signal. A control device (not shown) determines the communication protocol of the analog input signal and sets switches 78, 91, and 97 in accordance with the communication protocol of the analog input signal. For example, if the control device determines that the communication protocol of the analog input signal has a wide information-bandwidth of 200 kHz, switches 78, 91, and 97 are set in their first positions. On the other hand, if the control device determines that the communication protocol of the analog input signal has a narrow information-bandwidth of 10 kHz, switches 78, 91, and 97 are set in their second positions.

Sigma-delta modulator 74 receives the analog input signal from input terminal 71. Summing device 86 generates a first error signal by subtracting a first feedback signal from the analog input signal. The first feedback signal is generated by DAC 96 and is transmitted from the output of DAC 96 to the negative input of summing device 86. The first error signal is transmitted from the output of summing device 86 to the input of filter 87. Filter 87 processes the first error signal and generates a first filtered signal. The first filtered signal is transmitted from the output of filter 87 to the input of ADC 88. ADC 88 digitizes the first filtered signal and generates a first digital signal. The first digital signal is transmitted to the digital output of sigma-delta modulator 74 and to the input of DAC 96. DAC 96 generates the first feedback signal from the first digital signal and transmits the first feedback signal to the negative input of summing device 86.

When switches 78, 91, and 97 are set in their second positions, the first digital signal is transmitted to output terminal 72 since switch 78 is in its second position.

When switches 78, 91, and 97 are set in their first positions, the first digital signal is transmitted to the first input of DSP 77. In addition, the first filtered signal is transmitted from the output of filter 87 to the negative input of summing device 101 and DAC 96 transmits the first feedback signal to the positive input of summing device 101. Summing device 101 generates a second error signal by subtracting the first filtered signal from the first feedback signal. The second error signal is transmitted to the analog output of sigma-delta modulator 74 and is transmitted to the input of sigma-delta modulator 76, i.e., the positive input of summing device 106.

Summing device 106 generates a third error signal by subtracting a second feedback signal from the second error signal. The second feedback signal is generated by DAC 109 and is transmitted from the output of DAC 109 to the negative input of summing device 106. The third error signal is transmitted from the output of summing device 106 to the input of filter 107. Filter 107 processes the third error signal and generates a second filtered signal. The second filtered signal is transmitted from the output of filter 107 to the input of ADC 108. ADC 108 digitizes the second filtered signal and generates a second digital signal. The second digital signal is transmitted to the digital output of sigma-delta modulator 76 and to the input of DAC 109. In addition, the second digital signal is transmitted to the second input of DSP 77. DAC 109 generates the second feedback signal from the second digital signal.

DSP 77 generates a digital output signal by combining the first digital signal and the second digital signal to cancel out the quantization noise from the first digital signal. The digital output signal is transmitted to output terminal 72 from the output of DSP 77 since switch 78 is in its first position.

Like modulator 40 of FIG. 2, modulator 70 provides a device for digitizing an analog signal. Switches 78, 91, and 97 provide a means for altering the order of modulator 70 in accordance with the communication protocol of the received analog signal. By altering the order of modulator 70, the SNR of modulator 70 remains substantially constant when receiving analog signals having either wide or narrow information-bandwidths. Modulator 70 cascades at least two sigma-delta modulators to produce a higher-order modulator for receiving analog signals having wide information-bandwidths. By cascading at least two sigma-delta modulators, modulator 70 reduces problems with stability that higher-order single-loop modulators exhibit.

FIG. 4 is a block diagram of a single-loop sigma-delta modulator 120 having an input terminal 121 and an output terminal 122 in accordance with a fourth embodiment of the present invention. Modulator 120 includes a gain stage 124 having an input connected to input terminal 121 and an output connected to a summing device 126. Summing device 126 has a positive input, a negative input, and an output, wherein the positive input of summing device 126 is connected to the output of gain stage 124. The output of summing device 126 is connected to the input of a filter 127 and the output of filter 127 is connected to the input of a gain stage 129. The output of gain stage 129 is connected to the positive input of a summing device 131. The output of summing device 131 is connected to the input of a filter 133 and the output of filter 133 is connected to a switch 134.

By way of example, filters 127 and 133 are second-order filters and switch 134 is a single-throw double-pole switch having a plurality of terminals 137, 138, and 139. Terminal 137 is connected to the output of filter 133, terminal 138 is connected to the first terminal of a transmission path 141, and terminal 139 is connected to the input of a gain stage 142. The output of gain stage 142 is connected to the positive input of a summing device 144. The output of summing device 144 is connected to the input of a second-order filter 146 and the output of filter 146 is connected to the input of a gain stage 147. The output of gain stage 147 is connected to the positive input of a summing device 148. The output of summing device 148 is connected to the input of a second-order filter 149 and the output of filter 149 is connected to a single-throw double-pole switch 151 having a plurality of terminals 152, 153, and 154. In particular, terminal 152 is connected to the output of filter 149, terminal 153 is connected to the second terminal of transmission path 141, and terminal 154 is connected to the input of an ADC 156. The output of ADC 156 is commonly connected to output terminal 122 and to the input of a DAC 157. The output of DAC 157 is commonly connected to the inputs of gain stages 161, 162, 163, and 164. The outputs of gain stages 161, 162, 163, and 164 are connected to the negative inputs of summing 15 devices 126, 131, 144, and 148, respectively.

When switch 134 is in a first position, the output of filter 133 is electrically connected to the input of gain stage 142. On the other hand, when switch 134 is in a second position, the output of filter 133 is electrically connected to the first terminal of transmission path 141. When switch 151 is in a first position, the input of ADC 156 is electrically connected to the output of filter 149. When switch 151 is in a second position, the input of ADC 156 is electrically connected to the second terminal of transmission path 141.

The operation of sigma-delta modulator 120 is similar to the operation of sigma-delta modulator 10 of FIG. 1. Sigma-delta modulator 120 receives an analog input signal at input terminal 121 and generates a digital output signal at output terminal 122 by digitizing the analog input signal. Similar to sigma-delta modulator 10 of FIG. 1, the order of sigma-delta modulator 120 is altered by changing the positions of switches 134 and 151. For example, when switches 134 and 151 are in their first positions, sigma-delta modulator 120 is an eighth-order sigma-delta modulator. When switches 134 and 151 are in their second positions, sigma-delta modulator 120 is a fourth-order sigma-delta modulator.

It should be noted that the orders of filters 127, 133, 146, and 149 are not limitations of the present invention. Depending on the application, filters 127, 133, 146, and 149 can be single-order filters, fourth-order filters, etc. In addition, filters 127, 133, 146, and 149 can have different order values, e.g., filters 127 and 133 can be single-order filters and filters 146 and 149 can be second-order filters.

Figure 5:
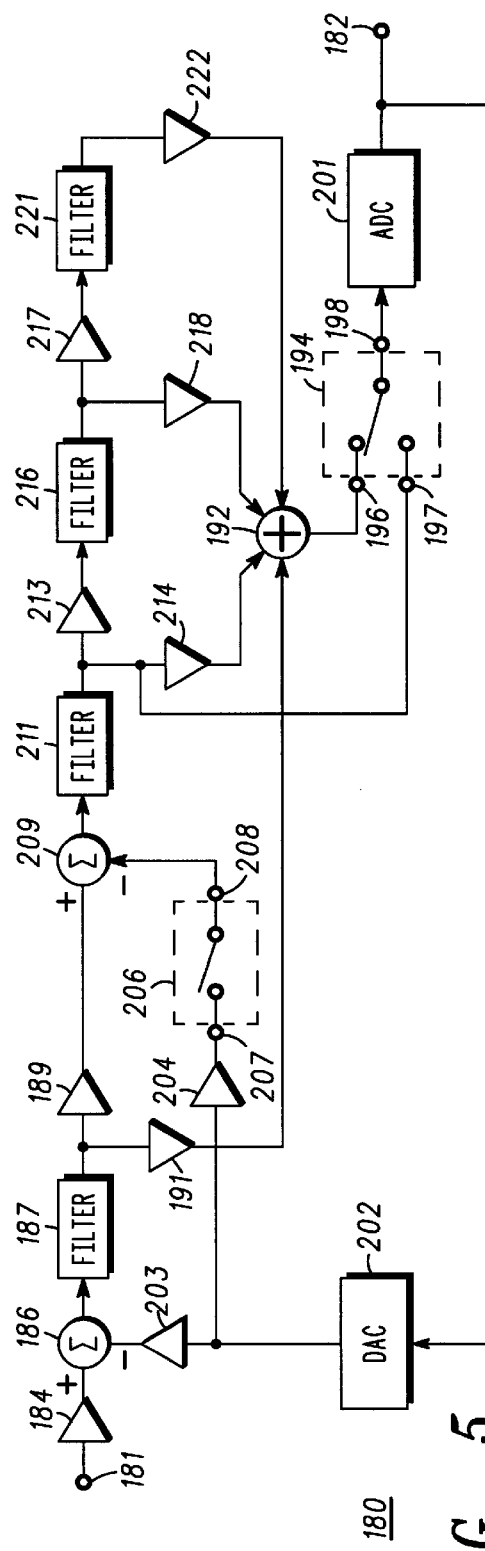
FIG. 5 is a block diagram of a sigma-delta modulator in accordance with a fifth embodiment of the present invention.

FIG. 5 is a block diagram of a sigma-delta modulator 180 having an input terminal 181 and an output terminal 182 in accordance with a fifth embodiment of the present invention. Modulator 180 includes a gain stage 184 having an input connected to input terminal 181 and an output connected to a summing device 186. Summing device 186 has a positive input, a negative input, and an output, wherein the positive input of summing device 186 is connected to the output of gain stage 184. The output of summing device 186 is connected to the input of a filter 187 and the output of filter 187 is commonly connected to the input of a gain stage 189 and to the input of a gain stage 191. The output of gain stage 191 is connected to a feedforward summing device 192. Summing device 192 has a plurality of inputs and an output connected to a switch 194. Switch 194 has a plurality of terminals 196, 197, and 198. Terminal 196 is connected to the output of summing device 192 and terminal 198 is connected to the input of an ADC 201. The output of ADC 201 is commonly connected to output terminal 182 and to the input of a DAC 202. The output of DAC 202 is commonly connected to the inputs of gain stages 203 and 204. The output of gain stage 203 is connected to the negative input of summing device 186 and the output of gain stage 204 is connected to a switch 206 having terminals 207 and 208. In particular, terminal 207 is connected to the output of gain stage 204 and terminal 208 is connected to the negative input of a summing device 209.

The positive input of summing device 209 is connected to the output of gain stage 189 and the output of summing device 209 is connected to the input of a filter 211. The output of filter 211 is commonly connected to the inputs of gain stages 213 and 214 and to terminal 197 of switch 194. The output of gain stage 214 is connected to a second input of summing device 192. The output of gain stage 213 is connected to the input of filter 216 and the output of filter 216 is commonly connected to the inputs of gain stages 217 and 218. The output of gain stage 218 is connected to the third input of summing device 192. The output of gain stage 217 is connected to a filter 221 and the output of filter 221 is connected to the input of a gain stage 222. The output of gain stage 222 is connected to the fourth input of summing device 192. By way of example, filters 187, 211, 216, and 221 are second-order filters. It should be noted that the orders of filters 187, 211, 216, and 221 are not limitations of the present invention. Depending on the application, filters 187, 211, 216, and 221 can be single-order filters, fourth-order filters, etc.

When switch 206 is in a first position, the output of gain stage 204 is electrically isolated from the negative input of summing device 209. On the other hand, when switch 206 is in a second position, the output of gain stage 204 is electrically connected to the negative input of summing device 209. Terminal 196 of switch 194 is electrically connected to terminal 198 when switch 194 is in a first position and terminal 197 is electrically connected to terminal 198 when switch 194 is in a second position.

The operation of sigma-delta modulator 180 is similar to the operation of sigma-delta modulator 10 of FIG. 1. Sigma-delta modulator 180 receives an analog input signal at input terminal 181 and generates a digital output signal at output terminal 182 by digitizing the analog input signal. In addition, sigma-delta modulator 180 has feedforward summation, thus sigma-delta modulator 180 can be used for low voltage applications. Similar to sigma-delta modulator 10 of FIG. 1, the order of sigma-delta modulator 180 is altered by toggling the positions of switches 194 and 206. For example, when switches 194 and 206 are in their first positions, sigma-delta modulator 180 is an eighth-order sigma-delta modulator. When switches 194 and 206 are in their second positions, sigma-delta modulator 180 is a fourth-order sigma-delta modulator.

By now it should be appreciated that a sigma-delta modulator and method for digitizing an analog signal have been provided. An advantage of the present invention is that it provides a sigma-delta modulator capable of receiving analog signals having multiple protocols. Another advantage of the present invention is that it provides a method for altering the order of the sigma-delta modulator based on the protocol of the received analog signal. Altering the order of the sigma-delta modulator in accordance with the protocol of the received analog signal results in the SNR of the sigma-delta modulator remaining substantially constant for protocols having either wide or narrow information-bandwidths. Although altering the order the sigma-delta modulator in accordance with the protocol is described as a automatic operation, the order of the sigma-delta modulator can be manually selected by a user or operator. Yet another advantage of the present invention, is that it provides a means for conserving power.

What is claimed is:

1. A sigma-delta modulator, comprising:
   a summing device having a first input, a second input, and an output;
   a first filter having an input coupled to the output of the summing device and an output;
   a second filter having an input coupled to the output of the first filter and an output;
   a first switch having a first terminal coupled to the output of the first filter, a second terminal coupled to the output of the second filter, and a third terminal;
   a quantizer having an input coupled to the third terminal of the first switch and an output; and
   a Digital-to-Analog Converter (DAC) having an input coupled to the output of the quantizer and an output coupled to the second input of the summing device.

2. The sigma-delta modulator of claim 1, wherein the output of the first filter is coupled to the input of the second filter and coupled to the first terminal of the first switch via a second switch, and wherein the second switch has a first terminal coupled to the output of the first filter, a second terminal coupled to the input of the second filter, and a third terminal coupled to the first terminal of the first switch.

3. The sigma-delta modulator of claim 1, wherein the first switch is a single-throw double-pole switch.

4. The sigma-delta modulator of claim 1, wherein the first filter and the second filter are fourth-order bandpass filters.

5. The sigma-delta modulator of claim 1, wherein the quantizer is a single-bit quantizer and wherein the DAC is a single-bit DAC.

6. A sigma-delta modulator, comprising:
   a first sigma-delta modulator having an input, a first output, and a second output;
   a second sigma-delta modulator having an input coupled to the first output of the first sigma-delta modulator and an output;

a first switch having a first terminal coupled to the second output of the first sigma-delta modulator, a second terminal, and a third terminal; and a signal processor having a first input coupled to the second output of the first sigma-delta modulator, a second input coupled to the output of the second sigma-delta modulator, and an output coupled to the second terminal of the first switch.

7. The sigma-delta modulator of claim 6, wherein the first output of the first sigma-delta modulator is coupled to the input of the second sigma-delta modulator via a second switch.

8. The sigma-delta modulator of claim 6, wherein the first switch is a single-throw double-pole switch.

9. The sigma-delta modulator of claim 6, wherein the first and second sigma-delta modulators are second-order modulators.

10. The sigma-delta modulator of claim 6, wherein the signal processor is a digital filter.

11. The sigma-delta modulator of claim 6, wherein the first sigma-delta modulator is comprised of:

a first summing device having a first input coupled to the input of the first sigma-delta modulator, a second input, and an output;

a filter having an input coupled to the output of the first summing device and an output;

an Analog-to-Digital Converter (ADC) having an input coupled to the output of the filter and an output coupled to the second output of the first sigma-delta modulator;

a Digital-to-Analog Converter (DAC) having an input coupled to the output of the ADC and an output coupled to the second input of the first summing device;

a first switch having a first terminal coupled to the output of the filter and a second terminal;

a second switch having a first terminal coupled to the output of the DAC and a second terminal; and a second summing device having a first input coupled to the second terminal of the second switch, a second input coupled to the second terminal of the first switch, and an output coupled to the first output of the first sigma-delta modulator.

12. The sigma-delta modulator of claim 11, wherein the filter is a fourth-order bandpass filter.

13. The sigma-delta modulator of claim 6, wherein the second sigma-delta modulator is comprised of:

a summing device having a first input coupled to the input of the second sigma-delta modulator, a second input, and an output;

a filter having an input coupled to the output of the summing device and an output;

an Analog-to-Digital Converter (ADC) having an input coupled to the output of the filter and an output coupled to the output of the second sigma-delta modulator; and a Digital-to-Analog Converter (DAC) having an input coupled to the output of the ADC and an output coupled to the second input of the summing device.

14. The sigma-delta modulator of claim 13, wherein the filter is a fourth-order bandpass filter.

15. A method for digitizing a signal having a protocol comprising the steps of:

a) selecting a signal path in accordance with the protocol of the signal, b) toggling at least one switch to select the signal path;

c) digitizing the signal, and c) altering a configuration of a sigma modulator in accordance with the protocol of the signal.

16. The method of claim 15, wherein the step of altering a configuration of a sigma-delta modulator further includes changing an order of the sigma-delta modulator.

17. The method of claim 16, wherein changing an order of the sigma-delta modulator further includes cascading two sigma-delta modulators.

18. The method of claim 16, wherein changing an order of the sigma-delta modulator further includes increasing the order of the sigma-delta modulator when the protocol has a wide information-bandwidth.

* * * * *